United States Patent
Zbinden

(10) Patent No.: US 6,846,117 B2
(45) Date of Patent: Jan. 25, 2005

(54) OPTICAL MODULE PACKAGE

(75) Inventor: Eric J. Zbinden, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 162 days.

(21) Appl. No.: 10/266,758

(22) Filed: Oct. 8, 2002

(65) Prior Publication Data
US 2004/0067031 A1 Apr. 8, 2004

(51) Int. Cl.$^7$ .............................................. G02B 6/36
(52) U.S. Cl. ....................... 385/92; 385/88; 385/89; 385/90; 385/91; 385/93; 385/49; 385/14; 385/33; 174/52.4; 439/408
(58) Field of Search ............................. 385/92, 88, 89, 385/90, 91, 93, 49, 14, 33; 174/52.4; 439/408

(56) References Cited

U.S. PATENT DOCUMENTS

| 4,930,857 | A | * | 6/1990 | Acarlar | 385/88 |
| 5,434,358 | A | | 7/1995 | Glahn et al. | 174/52.4 |
| 5,790,730 | A | * | 8/1998 | Kravitz et al. | 385/49 |
| 5,907,185 | A | | 5/1999 | Tatoh | 257/668 |
| 5,940,279 | A | * | 8/1999 | Gademann et al. | 361/823 |
| 5,940,563 | A | * | 8/1999 | Kobayashi et al. | 385/92 |
| 6,328,483 | B1 | | 12/2001 | Havasi et al. | 385/92 |

FOREIGN PATENT DOCUMENTS

| JP | 11 017041 | 1/1999 | 385/92 |
| JP | 11 145317 | 5/1999 | 385/92 |

* cited by examiner

*Primary Examiner*—Dean A. Reichard
*Assistant Examiner*—Anton Harris
(74) *Attorney, Agent, or Firm*—Trop, Pruner & Hu, P.C.

(57) ABSTRACT

An optical module package may include a body that, in one embodiment, may be made of metal. Ceramic inserts may be inserted into the metal body. The ceramic inserts may have a pair of shelves to facilitate electrical connection. In one embodiment, each shelf may include an upwardly directed contact surface and a downwardly directed contact surface. As a result, a more compact design may be formed in some embodiments which has desirable strength characteristics.

35 Claims, 3 Drawing Sheets

OPTICAL MODULE PACKAGE

BACKGROUND

This invention relates generally to packages for optical modules and, particularly, to packages that receive an optical fiber and provide electrical connections thereto.

Standard techniques to carry an electrical signal across the wall of a package for optical modules include multi-layer ceramic inserts. Standard ceramic designs for optical modules, commonly called butterfly packages, may include a base, a fiber feed through, a can body, and a ring frame made of metal, as well as one or more multi-layer ceramic inserts that receive electrical connectors. A lid is typically used to hermetically close the package by welding or soldering to a ring frame.

The ceramic inserts may be composed of multi-layer ceramic. The inserts typically carry direct current or low frequency electrical signals. An insert may include a base ceramic layer, a plated bottom, and a patterned plating on the top surface. A narrower ceramic layer or top layer is attached to the base ceramic layer in a way that creates two shelves. An outside shelf allows electrical leads to be soldered to the package and an inside shelf allows an electrical signal to be accessible from inside the package. The inside shelf typically receives wire bonds that further carry the signal to or from the circuitry mounted inside the package.

The ceramic inserts may be fitted and soldered between the body and the ring frame forming a hermetic seal. Usually, the ceramic insert is wider than the surrounding body and the ring frame. This ensures good hermetic soldering between the plated ceramic surfaces and the metal body and frame. As the metal wall thickness is reduced, the wall thickness of the ceramic inserts may be reduced as well. However, reliability issues start to appear as the ceramic thickness decreases and stress concentration increases. This minimum wall thickness dictates the minimum overall insert width and, therefore, the minimum size of the package.

Thus, there is a need for a way to make inserts for optical module packages that have substantial ceramic wall thicknesses with reduced overall width.

DETAILED DESCRIPTION

Figure 1:
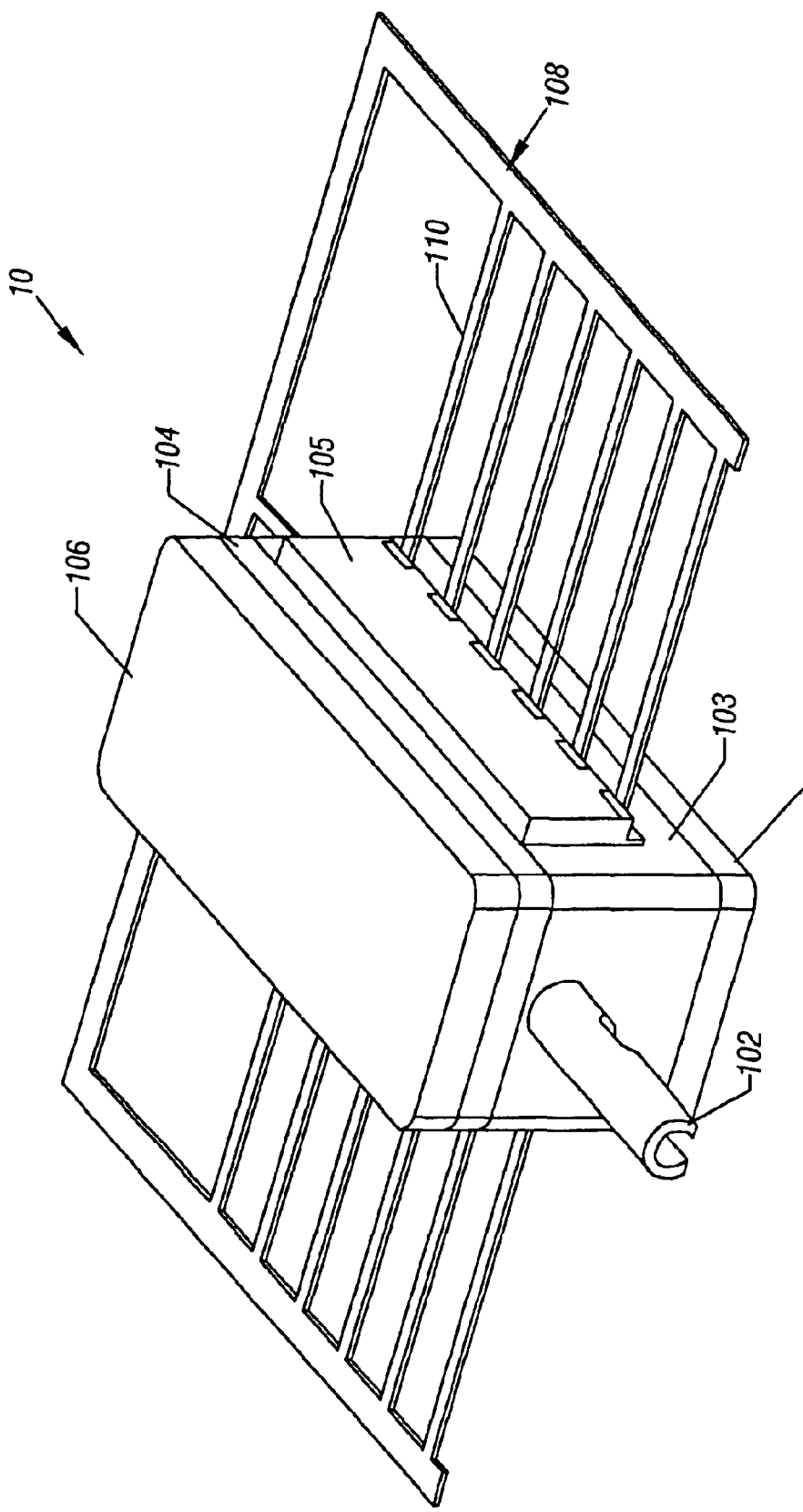
FIG. 1 is a perspective view of one embodiment of the present invention.

Referring to FIG. 1, a ceramic package 10 for an optical module includes a base 101, a fiber feed through 102, a can body 103, and a ring frame 104, which in one embodiment may be made of a metal such as Kovar. One or more multi-layer ceramic inserts, such as the insert 105, may be fitted into the body 103. A lid 106 may be used to hermetically close the package 10 by welding or soldering, as two examples, to the ring frame 104.

An electrical lead frame 108 may include leads 110 that electrically contact the inserts 105. In particular, the lead frame 108 may provide electrical signals to or receive electrical signals from the package 10. Likewise, the package 10 may receive an optical fiber (not shown) in the fiber feed through 102. In another embodiment, an optical window (not shown) may be provided to allow the passage of light between the inside and outside of the package 10.

The ceramic inserts 105 may be composed of multiple layers of ceramic in one embodiment. In some embodiments, the inserts 105 may be adapted to carry direct current or low frequency electrical signals. In other embodiments the inserts 105 may be adapted to handle high frequency signals. For example, inserts 105 may be located on each of three sides of the body 103.

Figure 2:
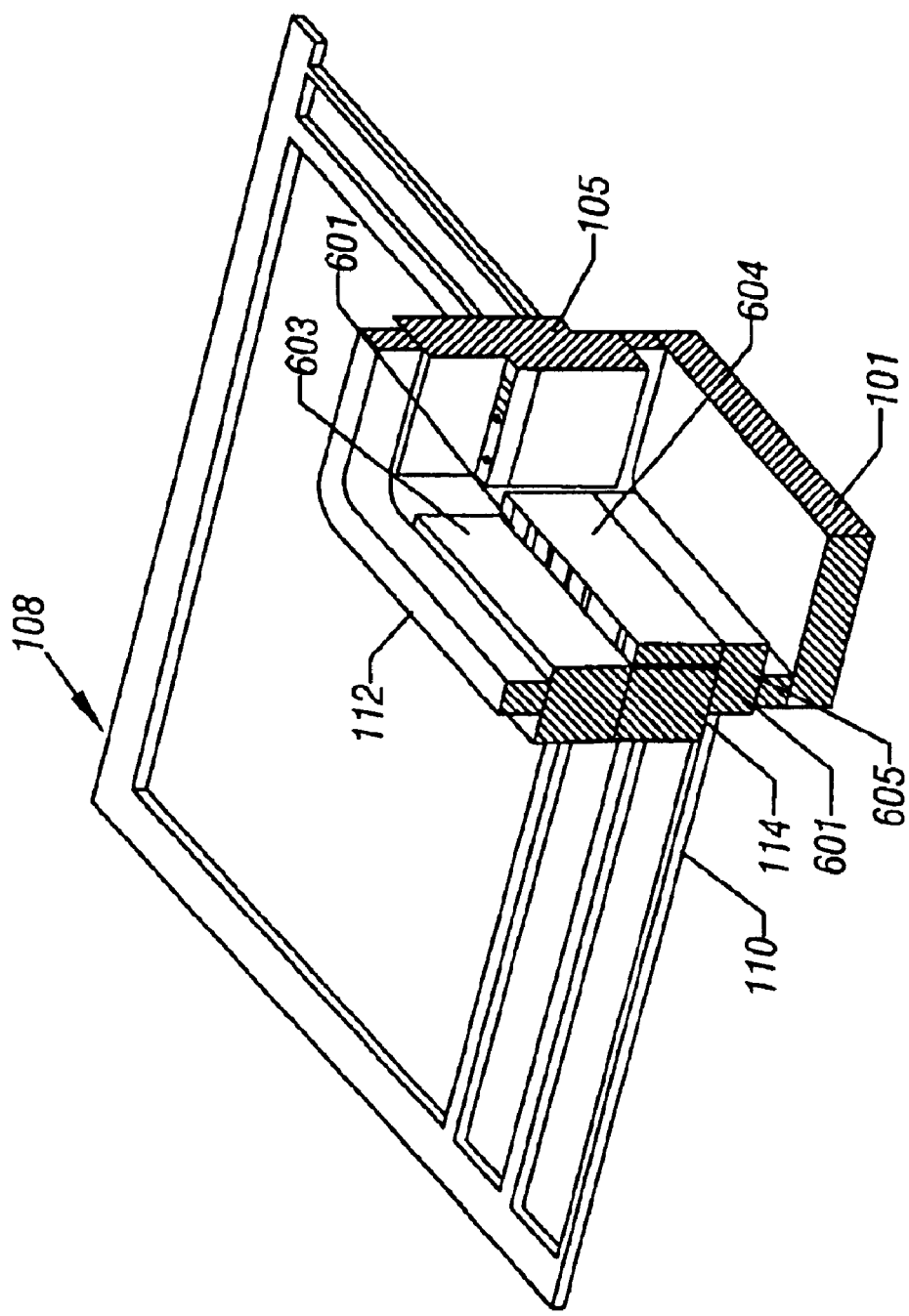
FIG. 2 is a partial cross-sectional view of a portion of the embodiment shown in FIG. 1 with the lid removed.

As shown in FIG. 2, a pair of contact shelves 601 and 114 may be located in different planes. Three ceramic inserts, including a top insert 603, a spacer 604, and a base insert 605, may be stacked up in a way that they create a shelf 601 facing upwardly, on one side and another shelf 114 facing downwardly, on another side of the package 10. The inserts 603, 604, and 605 may be fitted and soldered between the body 103 and the ring frame 112.

The shelf 114 on the spacer 604 may be adapted to receive electrical connections. For example, it may be metalized or otherwise plated for conducting electrical current and enabling electrical connections, for example, by soldering. Similarly, the shelf 601 defined on the upper surface of a spacer 604 may include a metallized or otherwise plated surface for allowing internal electrical connections, for example, by wire bonding or soldering. Vias 601 may extend through the spacer 604 to allow electrical connection between leads 110 electrically coupled to the shelf 601 and leads electrically coupled to the shelf 114.

Figure 3:
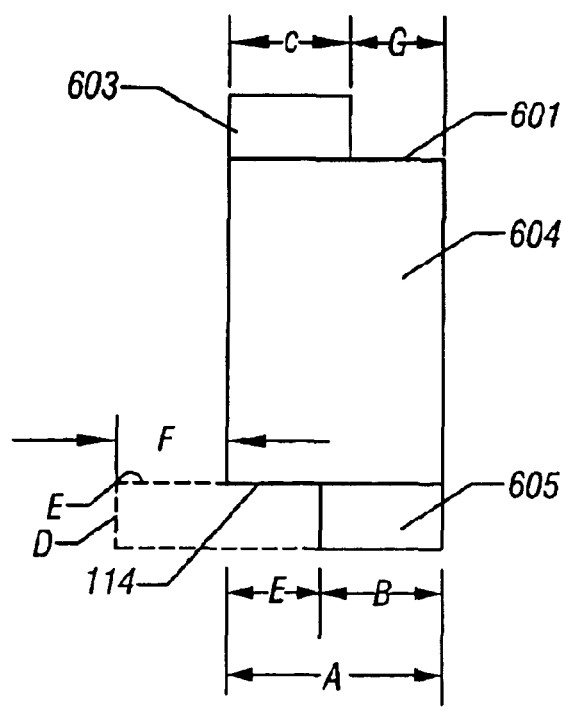
FIG. 3 is a scaled view of an insert in accordance with one embodiment of the present invention.

Thus, referring to FIG. 3, the top insert 603, spacer 604, and base insert 605 create a structure having a width A corresponding to the width of the spacer 604. The width A includes the width B of the base insert 605. The width A also includes the width C of the top insert 603.

Because electrical contacts can be made to the shelf 114 and the shelf 601, the overall width of the insert may be reduced. Namely, because electrical connections can be made from the top down, for example, to the shelf 601 and from the bottom up, for example, to the shelf 114, a more width compact structure can be defined.

For example, as shown in dashed lines in FIG. 3, a structure D in accordance with the prior art is illustrated having a width F needed to define an upwardly facing shelf E. The width F is the width necessary to make the appropriate electrical connections to the shelf E. Thus, in order to make an additional top down connection, an additional extension D of width F would be provided in conventional designs. As a result of the extension indicated at D, the overall width of the insert is increased by the width F compared to one embodiment of the present invention shown in solid lines in FIG. 3.

Increasing the width of the insert 105 results in larger packages with less real estate available inside the package. At the same time, in some embodiments the wall thickness of the insert 105 may not be materially changed, thereby increasing ceramic insert strength, decreasing internal stress, and improving the reliability of the overall package. For example, the bulk of a package 10 has the overall width A of the spacer 604 and no weak points are provided in the overall structure.

The interior shelf 601 is on a different level than the exterior shelf 114 in one embodiment of the present invention. Changing the shelf plane in the package 10 may provide advantages, such as offsetting the optical plane relative to the electrical leads so that an optical fiber does not necessitate a cut in a printed circuit board or allowing the inside substrate to be quasi-planar and avoiding changes of planes inside the package 10.

Figure 4:
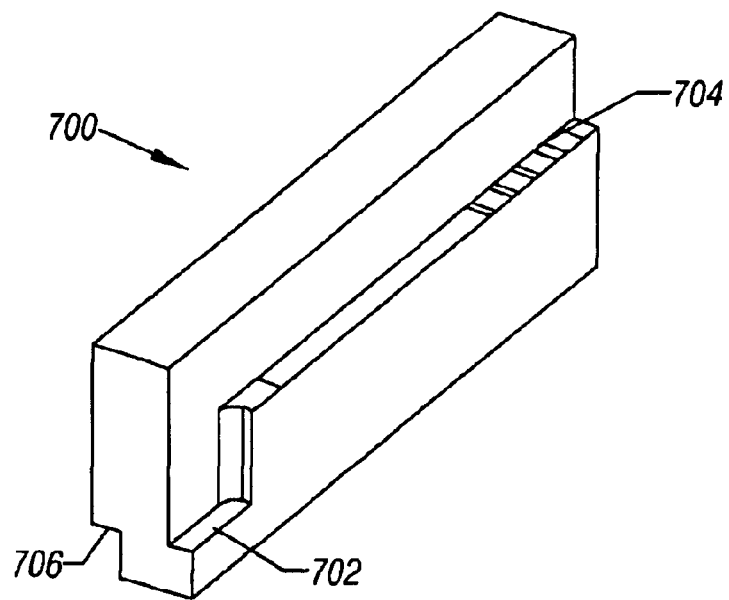
FIG. 4 is a perspective view of an insert in accordance with another embodiment of the present invention.

Referring to FIG. 4, in accordance with another embodiment of the present invention, an insert 700 includes a lower inner shelf 702, an upper inner shelf 704, and an inverted outer shelf 706. Thus, the insert 700 includes multiple shelves at different heights and includes multiple internal shelves. In other embodiments any number of internal and external shelves may be provided.

Thus, in accordance with some embodiments of the present invention, optical module packages may be made that have substantial ceramic wall thickness and reduced overall width. By avoiding the need to have two opposed upwardly facing shelves on opposed sides of the package, a more efficient package design may be achieved. In some embodiments this result may be achieved by allowing both upwardly and downwardly facing contact surfaces on shelves. Vias may be provided through the shelves to interconnect the upwardly and downwardly facing surfaces on the same shelf.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   providing an optical module package including a body and a cover over said body; and
   providing an insert in said body including a first separate piece having an upwardly facing surface and a downwardly facing surface, each of said surfaces including contacts to enable electrical connections to be made to said package, said insert further including a second separate piece secured to said downwardly facing surface and a third separate piece secured to said upwardly facing surface.

2. The method of claim 1 including providing an insert which is made of a different material than said body.

3. The method of claim 2 including providing a via between said upwardly and downwardly facing surfaces.

4. The method of claim 1 including forming said insert from a plurality of portions.

5. The method of claim 4 including forming said insert from a plurality of stacked portions.

6. The method of claim 1 including providing a plurality of upwardly facing surfaces at different levels.

7. The method of claim 1 including providing a plurality of upwardly facing surfaces at the same level.

8. The method of claim 1 including providing a plurality of surfaces on one side of said insert facing the same direction.

9. The method of claim 1 including providing said upwardly facing and downwardly facing surfaces in different planes.

10. The method of claim 1 including providing said upwardly facing and downwardly facing surfaces in the same plane.

11. The method of claim 9 including providing said upwardly and downwardly facing surfaces on opposite sides of said insert.

12. The method of claim 1 including forming said insert from three sections including a middle section defining said upwardly and downwardly facing surfaces and upper and lower sections having a width less than the width of a middle section.

13. An optical module package comprising:
    a body;
    a cover over said body; and
    an insert in said body including three separate portions secured together including a middle piece including an upwardly facing surface and a downwardly facing surface, each of said surfaces including contacts to enable electrical connections to said package, a second separate piece secured to said upwardly facing surface and a third separate piece secured to said downwardly facing surface.

14. The package of claim 13 wherein said body is formed of metal.

15. The package of claim 13 wherein said insert is made of ceramic.

16. The package of claim 13 wherein said insert is made of a different material than said body.

17. The package of claim 13 including a via between said upwardly and downwardly facing surfaces.

18. The package of claim 13 wherein said insert is formed of a plurality of discrete portions.

19. The package of claim 18 wherein said insert is formed of a plurality of stacked discrete portions.

20. The package of claim 13 wherein said insert includes at least two upwardly facing surfaces at different levels.

21. The package of claim 13 wherein said insert includes at least two upwardly facing surfaces at the same level.

22. The package of claim 13 wherein said upwardly and downwardly facing surfaces are in different planes.

23. The package of claim 13 wherein said upwardly and downwardly facing surfaces are in the same plane.

24. The package of claim 22 wherein said upwardly and downwardly facing surfaces are on opposite sides of said insert.

25. The package of claim 13 wherein said insert includes at least three sections including a middle section defining said upwardly and downwardly facing surfaces, and upper and lower sections each having a width less than a width of said middle section.

26. A package comprising:
    a body; and
    an insert in said body including three separate pieces secured together, a first separate piece including an upwardly facing surface and a downwardly facing surface, each of said surfaces including contacts to enable electrical connections to said package, said insert further including a second separate piece secured to said first piece, said second separate piece secured to said upwardly facing surface, said insert further including a third separate piece, said third separate piece secured to said first separate piece on said downwardly facing surface.

27. The package of claim 26 wherein said upwardly facing surface is on the interior of said body and said downwardly facing surfaces is on the exterior of said body.

28. The package of claim 26 wherein each of said surfaces include contacts for making electrical connections.

29. The package of claim 26 wherein said body is formed of metal.

30. The package of claim 26 wherein said insert is made of ceramic.

31. The package of claim 26 including an electrical link between said upwardly and downwardly facing surfaces.

32. The package of claim 26 wherein one of said surfaces is on the interior of said body and the other of said surfaces is on the exterior of said body, said surfaces being in different planes.

33. The package of claim 26 wherein one of said surfaces is on the interior of said body and the other of said surfaces is on the exterior of said body, said surfaces being in the same plane.

34. The package of claim 32 including a plurality of surfaces on the interior of said package at different levels, each of said surfaces including electrical contacts to make an electrical connection.

35. The package of claim 26 including a plurality of leads coupled to said surfaces.

* * * * *